(12) United States Patent
Hayes et al.

(10) Patent No.: US 11,577,251 B2
(45) Date of Patent: Feb. 14, 2023

(54) TEMPERATURE CONTROL DEVICE

(71) Applicant: EVONETIX LTD, Little Chesterford (GB)

(72) Inventors: Matthew James Hayes, Little Chesterford (GB); Andrew James Ferguson, Little Chesterford (GB); Vasile Dan Juncu, Little Chesterford (GB); Stephen Temple, Little Chesterford (GB)

(73) Assignee: EVONETIX LTD, Little Chesterford (GB)

( * ) Notice: Subject to any disclaimer, the term of this patent is extended or adjusted under 35 U.S.C. 154(b) by 943 days.

(21) Appl. No.: 16/461,913

(22) PCT Filed: Nov. 2, 2017

(86) PCT No.: PCT/GB2017/053297
§ 371 (c)(1),
(2) Date: May 17, 2019

(87) PCT Pub. No.: WO2018/104698
PCT Pub. Date: Jun. 14, 2018

(65) Prior Publication Data
US 2019/0275527 A1  Sep. 12, 2019

(30) Foreign Application Priority Data
Dec. 9, 2016 (GB) .................... 1620982

(51) Int. Cl.
*G01K 7/01* (2006.01)
*B01L 7/00* (2006.01)
(Continued)

(52) U.S. Cl.
CPC .............. *B01L 7/52* (2013.01); *G05D 23/193* (2013.01); *G05D 23/2033* (2013.01);
(Continued)

(58) Field of Classification Search
CPC ...... F28D 15/02; B01L 7/52; B01L 2200/147; B01L 2300/1827; B01L 2300/185;
(Continued)

(56) References Cited

U.S. PATENT DOCUMENTS 4,982,093 A * 1/1991 Voles ..................... H01L 37/02
250/338.3
5,700,715 A * 12/1997 Pasch ................ H01L 23/53285
257/E21.511
(Continued)

FOREIGN PATENT DOCUMENTS

CN   101641150       2/2010
CN   202189788 U1 * 11/2012
(Continued)

OTHER PUBLICATIONS

Office Action for SG Application No. 11201904146R dated Jun. 9, 2020, 7 pages.
(Continued)

*Primary Examiner* — Gail Kaplan Verbitsky
(74) *Attorney, Agent, or Firm* — Nixon & Vanderhye P.C.

(57) ABSTRACT

A temperature control device (2) comprises a number of active thermal sites (6) disposed at respective locations on a substrate (10), each comprising a heating element (13) for applying a variable amount of heat to a corresponding site of a medium and a thermal insulation layer (16) disposed between the heating element and the substrate. At least one passive thermal region (8) is disposed between the active thermal sites (6) on the substrate (10), each passive thermal region (8) comprising a thermal conduction layer (18) for conducting heat from a corresponding portion of the medium to the substrate (10). The thermal conduction layer (18) has a lower thermal resistance in a direction perpendicular to a plane of the substrate (10) than the thermal insulation layer (16). This enables precise control over both
(Continued)

heating and cooling of individual sites in a flowing fluid, for example.

14 Claims, 9 Drawing Sheets

(51) Int. Cl.
  *G05D 23/20* (2006.01)
  *H01L 23/38* (2006.01)
  *H01L 35/30* (2006.01)
  *G05D 23/19* (2006.01)

(52) U.S. Cl.
  CPC .............. *H01L 23/38* (2013.01); *H01L 35/30* (2013.01); *B01L 2200/12* (2013.01); *B01L 2200/147* (2013.01); *B01L 2300/0861* (2013.01); *B01L 2300/185* (2013.01); *B01L 2300/1827* (2013.01); *B01L 2300/1883* (2013.01)

(58) Field of Classification Search
  CPC .............. B01L 23/1883; G05D 23/193; G05D 23/2033; H01L 23/38; H01L 2200/12; G01K 7/01; G01K 7/015; G01K 7/14
  See application file for complete search history.

(56) References Cited

U.S. PATENT DOCUMENTS

| | | | |
|---|---|---|---|
| 5,819,842 A | 10/1998 | Potter et al. | |
| 2003/0008286 A1 | 1/2003 | Zou et al. | |
| 2005/0233540 A1* | 10/2005 | Yoon | H01L 21/763 257/E21.628 |
| 2005/0254547 A1* | 11/2005 | Zribi | G01K 17/006 374/10 |
| 2007/0116614 A1* | 5/2007 | Onoue | G05D 23/1934 422/198 |
| 2016/0167518 A1 | 5/2016 | Chang et al. | |

FOREIGN PATENT DOCUMENTS

| | | | | |
|---|---|---|---|---|
| CN | 104626422 | | 5/2015 | |
| CN | 104681612 A | * | 6/2015 | ........... H01L 29/401 |
| CN | 105786041 | | 7/2016 | |
| CN | 106919203 A | * | 7/2017 | ............. G01N 27/12 |
| CN | 113993624 A | * | 1/2022 | ................ B01L 7/52 |
| EP | 0 545 736 | | 6/1993 | |
| EP | 0 567 038 | | 10/1993 | |
| EP | 1637228 A1 | * | 3/2006 | ................ B01L 7/52 |
| EP | 1 974 816 | | 10/2008 | |
| EP | 1976034 A2 | * | 10/2008 | ................ G01J 5/12 |
| EP | 2 551 894 | | 1/2013 | |
| JP | H7-25047 | | 1/1995 | |
| JP | H10-34926 | | 2/1998 | |
| JP | H11-339937 | | 12/1999 | |
| JP | 2011-204812 | | 10/2011 | |
| JP | 7104029 B2 | * | 7/2022 | ................ B01L 7/04 |
| TW | 200618221 | | 6/2006 | |
| TW | 200837907 | | 9/2008 | |
| TW | 1557527 | | 11/2016 | |
| WO | WO-2016197106 A1 | * | 12/2016 | ........ B01L 3/502715 |
| WO | WO-2021099477 A1 | * | 5/2021 | ............. G01J 5/024 |

OTHER PUBLICATIONS

Office Action for CN Application No. 201780074729.5 dated Dec. 30, 2020, 10 pages.
International Search Report and Written Opinion of the ISA for PCT/GB2017/053297, dated Jan. 18, 2018, 17 pages.
Search Report for GB 1620982.7, dated May 26, 2017, 3 pages.
Dreinhoefer, "Controller Tuning for a Slow Nonlinear Process", IEEE Control Systems Magazine, vol. 8, No. 2, Apr. 30, 1988, 5 pages.
English translation of Office Action for JP Application No. 2019-530166 dated Jul. 6, 2021, 3 pages.
Second Office Action for CN Application No. 201780074729.5 dated Aug. 12, 2021 and English translation, 26 pages.
Office Action for TW Application No. 106141277 dated Jan. 19, 2021 and English translation, 6 pages.

* cited by examiner

TEMPERATURE CONTROL DEVICE

This application is the U.S. national phase of International Application No. PCT/GB2017/053297 filed 2 Nov. 2017, which designated the U.S. and claims priority to GB Patent Application No. 1620982.7 filed 9 Dec. 2016, the entire contents of each of which are hereby incorporated by reference.

The present technique relates to the field of temperature control, more particularly, it relates to controlling temperatures at multiple sites of a medium.

Controlling the pattern of heat applied at different sites in a medium (e.g. a fluid or solid) can be useful for some applications, such as for control of chemical reactions at the respective sites for example, as chemical reactions can be exponentially dependent on temperature. To be able to set different temperatures at different sites, or to change the temperature at a given site over time, some sites may need to be heated while other sites may need to be cooled. However, it can be challenging to provide a device which allows fast bidirectional control of the temperature at the different sites while supporting the range of temperatures required for some applications.

At least some examples provide a temperature control device for controlling temperatures at a plurality of sites of a medium, comprising:

a plurality of active thermal sites disposed at respective locations on a substrate, each active thermal site comprising a heating element configured to apply a variable amount of heat to a corresponding site of said medium and a thermal insulation layer disposed between the heating element and the substrate; and one or more passive thermal regions disposed between the plurality of active thermal sites on the substrate, each passive thermal region comprising a thermal conduction layer configured to conduct heat from a corresponding portion of the medium to the substrate;

wherein the thermal conduction layer of said one or more passive thermal regions has a lower thermal resistance in a direction perpendicular to a plane of the substrate than the thermal insulation layer of said plurality of active thermal sites.

At least some examples provide a method for controlling temperatures at a plurality of sites of a medium, comprising:

providing the medium on a temperature control device comprising a plurality of active thermal sites disposed at respective locations on a substrate and one or more passive thermal regions disposed between the plurality of active thermal sites on the substrate;

each active thermal site comprising a heating element configured to apply a variable amount of heat to a corresponding site of said medium and a thermal insulation layer disposed between the heating element and the substrate;

each passive thermal region comprising a thermal conduction layer configured to conduct heat from a corresponding portion of the medium to the substrate; and the thermal conduction layer of said one or more passive thermal regions having a lower thermal resistance in a direction perpendicular to a plane of the substrate than the thermal insulation layer of said plurality of active thermal sites; and controlling the amount of heat applied by the heating elements of the plurality of active thermal sites to control the temperatures at said plurality of sites of the medium.

At least some examples provide a method of manufacturing a temperature control device, comprising:

forming a plurality of active thermal sites at respective locations on the substrate and one or more passive thermal regions disposed between the plurality of active thermal sites on the substrate; wherein:

each active thermal site comprises a heating element configured to apply a variable amount of heat to a corresponding site of said medium and a thermal insulation layer disposed between the heating element and the substrate;

each passive thermal region comprises a thermal conduction layer configured to conduct heat from a corresponding portion of the medium to the substrate; and the thermal conduction layer of said one or more passive thermal regions has a lower thermal resistance in a direction perpendicular to a plane of the substrate than the thermal insulation layer of said plurality of active thermal sites.

Further aspects, features and advantages of the present technique will be apparent from the following description of examples, which is to be read in conjunction with the accompanying drawings, in which:

FIG. 1 schematically illustrates an example of a temperature control device for controlling temperatures at respective sites within a medium;

Figure 1:
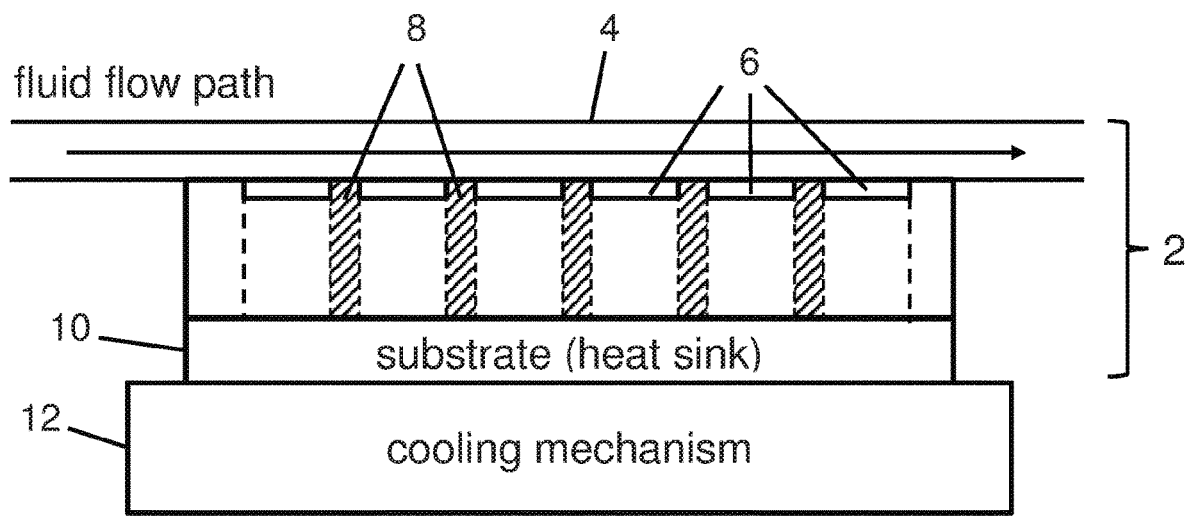

A temperature control device for controlling temperatures at multiple sites of a medium comprises a number of active thermal sites disposed at respective locations on a substrate, with each active thermal site comprising a heating element for applying a variable amount of heat to a corresponding site of the medium, and a thermal insulation layer disposed between the heating element and the substrate. One or more passive thermal regions are disposed between the active thermal sites on the substrate, with each passive thermal region comprising a thermal conduction layer for conducting heat from a corresponding portion of the medium to the substrate. The thermal conduction layer of the passive cooling region(s) has a lower thermal resistance in a direction perpendicular to a plane of the substrate than the insulating layer of the active thermal sites. When in use, the substrate can act as a heat sink (either by having the substrate exposed to room temperature, or by providing cooling of the substrate if lower temperatures are required). Hence, the thermal conduction layer in the passive regions enables the passive regions to provide cooling of the medium in the regions between the active thermal sites, so that less cooling needs to be provided by the active thermal sites themselves. This enables the active thermal sites to be designed to be more efficient for heating, since a thermal insulation layer which has a higher thermal resistance can be used between the heating element and the substrate as it is no longer required to allow so much heat to pass to the substrate to support cooling. This means that during heating less heat is lost to the substrate and therefore the overall temperature range supported by the device can be higher.

This can be contrasted with an alternative approach, which would be to provide a number of active sites which are the sole source of heating/cooling, each site having a heater with variable heat output, with cooling being provided when the heat from the heater is less than the heat lost to the substrate acting as a heat sink (with the boundaries between the active sites having the same or higher thermal resistance than the active sites). However, a problem with this approach is that when the medium above a given active site is at a relatively low temperature but further cooling is still required, the heat flow from the active site to the substrate would be relatively low (since the heat flow depends on the temperature difference across the heat flow path), and so to achieve further cooling the material of the active site would need sufficiently low thermal resistance that there is enough heat flow to the substrate at low temperatures. On the other hand, when the temperature at the corresponding site on the medium is relatively high, then the temperature difference across the heating site would be much larger and so the amount of heat lost to the substrate would be large. Therefore, to heat the corresponding site of the medium to even higher temperature, this would require a great amount of power to be applied to the heating element to counteract the heat lost to the substrate below. In practice, the maximum power supported by the heating element may be limited due to design constraints. Hence, an approach which uses the same site to provide the full heating/cooling functionality will be limited in the range of temperatures which can be controlled at a given site of the medium.

In contrast, with the present technique, the passive thermal regions between the active thermal sites include a layer which is more thermally conductive than the thermal insulation layer between the heating element and the substrate in the active sites. As cooling can be provided by the passive thermal regions, this means that the active sites do not need to provide as much cooling, and so can be made from a more thermally insulating material, so that less heat is lost to the substrate at the active sites and so more of the power of the heating element can be used for heating the medium itself. Hence, for a given amount of cooling to be provided and a given power available from the heating element, the maximum temperature achievable can be increased compared to the alternative approach discussed above. Hence, a wider range of temperatures can be controlled at each site using the temperature control device.

The passive sites are passive in the sense that, while the amount of cooling provided at the passive sites will depend on the temperature difference across them (which may indirectly depend on the temperature settings at neighbouring active sites), the temperature control device does not directly control the amount of heat flow at the passive sites, and instead the thermal conduction layer simply provides a given amount of thermal resistance to heat flow, which is a lower resistance than the thermal insulation layer at the active sites. As well as helping improve the range of temperatures achievable using the active sites, when the device is used for controlling temperatures within a flowing fluid, the passive regions can also help to reduce the "history" effect of heating at previous sites passed by the fluid, as the passive regions can cool the fluid closer to the substrate temperature to reduce the variability of the temperature of the fluid entering a given active site. This reduces the necessary loop gain of the control loop for controlling the heater at each site (see further discussion below).

On the other hand, the active sites are active in the sense that the amount of heating or cooling provided can be controlled by varying the power provided by the heating element. Nevertheless, the amount of heat flow to or from the medium at the active sites depends not only on the amount of heat provided by the heating element, but also on the temperatures around the active site, which may affect how much of the heat from the heating element is lost to the substrate or to surrounding passive thermal sites.

Hence, control circuitry may be provided to control whether a selected active thermal site provides heating of a corresponding site of the medium using the heating element or cooling of the corresponding site by heat flow through the thermal insulation layer to the substrate, in dependence on whether an amount of heat generated by the heating element in that active thermal site is greater or smaller than a threshold amount. The threshold amount may effectively represent the amount of heat that has to be generated by the heating element in order to counteract the heat lost to the substrate or the surrounding passive thermal sites.

This threshold amount may depend on a number of factors, including the thermal resistance of the thermal insulation layer of the active thermal site in a direction perpendicular to the plane of the substrate. For a given maximum heater power, the range of temperatures supported will tend to be shifted towards lower temperatures if the thermal insulation layer has a lower thermal resistance than if it has a higher thermal resistance. Hence, the bias point, at which the heating element counteracts the heat lost to surrounding areas other than the medium heat sink, can be carefully controlled by selecting an insulation layer with a given thermal resistance. Hence, different embodiments may be designed for different applications (depending on the required temperature ranges) by choosing insulation materials with different thermal resistance (e.g. by choosing different materials themselves, or by varying the physical structure of a given insulation material, such as by including voids).

The threshold amount may also be temperature dependent, e.g. a hotter active site will tend to lose more heat to the substrate than a cooler active site as there is a larger temperature difference across it. Hence, depending on the temperature of an active site, different amounts of the power may need to be delivered by the heating element in order to achieve a given amount of heat flow to the medium. This makes control of the heating element in order to provide a given temperature setting more complex.

Hence, each active thermal site may comprise a temperature sensor for sensing a temperature at the corresponding active thermal site. A number of feedback loops may be provided, each corresponding to one of the active thermal sites for controlling the heating element of that active thermal site. Each feedback loop may implement a transfer function for determining a target amount of heat to be applied to the corresponding site of the medium in dependence on the temperature sensed by the temperature sensor of the corresponding active thermal site and a target temperature specified for the corresponding site of the medium. A further function (referred to as a linearizer function below) may then map the target amount of heat determined by the transfer function to an input signal for controlling the heating element of the corresponding active thermal site. The linearizer function may be a function of the temperature sensed by the temperature sensor of the corresponding active thermal site, and may determine the input signal in dependence on a sum of the target amount of heat and an amount of heat lost from the heating element of the active thermal site to the substrate and surrounding passive thermal regions.

One might expect that a feedback loop for controlling the heater in dependence on the measured temperature at an active site should simply implement a single transfer function mapping the error between the target and measured temperatures directly to the heater input signal. However, such a control loop would be extremely challenging to implement in practice. Not all the heat supplied by the heater is supplied to the medium itself, as some heat is lost to the substrate via the thermal insulation layer in the active thermal sites or to passive thermal regions surrounding the active thermal site. The amount of heat lost to surrounding areas is temperature-dependent, and as each site can be at a different temperature, the heat lost varies from site to site. Hence, in a transfer function for which the plant is the heat provided by the heater, rather than the heat flow into the medium, the loop gain would become a function of the active site temperature, and so no unique controller (transfer function) would exist to ensure stability and accuracy over all possible active site temperatures.

In contrast, by separating the control of the heater into two parts, a stable control loop can be designed. The first part of control is the transfer function mapping the error between the measured and target temperatures to the target amount of heat to be supplied to the fluid (without considering how to control the heater to provide that target amount of heat). By providing a closed-loop control transfer function where the plant is the target amount of heat to be supplied to the medium rather than the amount of heat to be supplied by the heater, the loop gain can be made independent of the temperature of the site, which allows the loop to be modelled as a linear time invariant system according to classical control theory. On the other hand, the subsequent linearizer function maps the target amount of heat determined by the transfer function to the heater control input. The linearizer function can be designed according to a model of the heat flow at a given active site (dependent on the measured temperature of the active site). By bringing the temperature-dependent heat loss out of the closed-loop transfer function, the loop gain can effectively be "linearised" (approximated to a linear time invariant system), hence the term "linearizer function". This allows for design of a stable control loop.

One may question why the closed-loop controller is provided, if one can already model the heat flow at an active site using the linearizer function—could a heat flow model representing the relationship between the target temperature and the power to be supplied by the heater be used without a closed loop transfer function? However, the amount of heat required to be supplied to the medium to set a given target temperature depends not only on the target temperature, but also on the previous temperature of the medium to be heated (there is some "history" to be accounted for). For heating of a solid medium, the history depends on previous temperature settings at a given active site (which could change over time). For heating of a fluid medium flowing over the active and passive sites, the history depends on the heating applied at other sites which the fluid passed before reaching the current active site. For example, if a given part of the fluid flows from a hotter site to a cooler site, we would expect to need to provide cooling to reduce the temperature rather than heating to increase the temperature, whereas the same target temperature setting for the second site could require heating if it follows an even cooler site. While the passive sites can help "reset" the temperature history by cooling the medium closer to the substrate temperature, there is still a history-dependent effect which would be difficult to account for with a simple heat flow model alone. By using a closed-loop approach where the target amount of heat to the fluid is continuously adjusted according to a certain transfer function dependent on the error between the target/measured temperatures, this enables us to achieve better temperature control (even if there is no actual knowledge of the previous temperature of the medium, e.g. the closed loop transfer function does not need to account for the actual temperature of the fluid arriving at an active site, which may still be unknown).

The relation used for the linearizer function can be derived as a function representing an analytic inversion of a thermal model of the temperature control device as will be described in more detail in the examples below. The thermal model may be a model in which thermal properties of heat flow, thermal resistance and thermal mass may be represented by electrical current, electrical resistance and electrical capacitance respectively, to allow the required non-linear control function to be derived by analogy to an electrical circuit.

In particular, the linearizer function may map the target amount of heat qii to an actual amount of heat q to be supplied by the heating element of a given active thermal site according to the following relation:

$$q = q_{fi} + \frac{T_i - T_{HS}}{\frac{R_{iz}}{2}} + \left\{ \frac{T_i - R_1 \| R_3 \left[ \frac{T_i}{R_1} + \frac{T_{HS}}{R_3} \right]}{R_1} \right\}$$

where:

$q_{fi}$ represents the target amount of heat to be supplied to the medium at the given active thermal site (determined as a function of the difference between the target temperature for the given active thermal site and the temperature sensed by the temperature sensor of the given active thermal site);

$T_i$ represents the temperature sensed by the temperature sensor of the given active thermal site;

$T_{HS}$ represents the temperature of the substrate (acting as a heat sink);

$R_{iz}$ represents the thermal resistance of the thermal insulation layer of the active thermal site in the direction perpendicular to the plane of the substrate;

$$\frac{1}{R_1 \| R_3} = \frac{1}{R_1} + \frac{1}{R_3}$$

-continued $$R_1 = \frac{1}{\frac{4}{R_{ix}} + \frac{4}{R_{iy}}} + \frac{1}{\frac{4}{R_{cs}} + \frac{4}{R_{cy}}}$$

$$R_3 = \frac{R_{cz}}{8}$$

$R_{ix}$ and $R_{iy}$ represent the thermal resistance of the thermal insulation layer of an active thermal site in two orthogonal directions parallel to the plane of the substrate;

$R_{cx}$ and $R_{cy}$ represent the thermal resistance of the thermal conduction layer of a passive thermal region in two orthogonal directions parallel to the plane of the substrate; and $R_{cz}$ represents the thermal resistance of the thermal conduction layer of a passive thermal region in the direction perpendicular to the plane of the substrate.

In some examples the heating element may comprise a resistive heating element. Although thermo-electric devices or other types of heating could also be used, a resistive heating element can be simpler to manufacture and control. For a resistive heating element, the current I to be applied to the heating element may be determined according to $$I = \sqrt{\frac{q}{r}},$$

where q is determined according to the linearizer function as defined above and r is the resistance of the heating element.

In some examples, the thermal insulation layer in the active thermal sites may have a greater thermal resistance in a direction parallel to the plane of the substrate than in a direction perpendicular to the plane of the substrate. Making the thermal insulation layer less "leaky" in the lateral direction than across the thickness of the substrate allows the thermal insulation layer to support a given amount of cooling at the active thermal sites by heat flow to the substrate, while reducing the amount of heat lost through parasitic paths via surrounding passive thermal regions. Reducing the amount of heat lost to the passive regions not only makes heating at the active elements more efficient (a heater supporting a given maximum power can therefore support higher temperatures of the medium), but also simplifies the thermal model for deriving the non-linear control function discussed above, so that a simpler equation can be used which is less complex to implement in mapping circuitry. There are a number of ways in which the thermal insulation layer can be constructed to have a greater thermal resistance in the direction running in the plane of the substrate than in the transverse direction.

For example, the insulating layer could have a thin film structure, where the thickness z of the thermal insulation layer in the direction perpendicular to the plane of the substrate is substantially smaller than a smallest dimension L of the thermal insulation layer of the active thermal site in a direction parallel to the plane of the substrate. For example, z/L could be less than 0.1. In practice, z/L could be made smaller than 0.1, e.g. <0.05, or <0.01. In general, if the thickness is small in comparison to the lateral dimensions, then the thermal insulation layer will present a relatively large area for heat flow to the substrate, but a much smaller area for heat flow to the surrounding passive thermal regions, to provide more efficient heating and a simpler non-linear control function. The thin film approach can be suitable for some types of insulating material.

However, other types of insulating material may not have enough thermal resistance to provide sufficient insulation in the direction perpendicular to the plane if the thickness is reduced. For example, if silicon dioxide is used as the insulator, its inherent thermal conductivity may limit how thin the layer can be made if the thermal insulation layer is to provide enough insulation. While other materials could be chosen, silicon dioxide can be simpler to manufacture as it can allow the insulator to be formed by oxidisation of silicon used as a substrate for other parts of the device. Similarly, there may also be other materials for which the thin film approach (made of a single solid material) may not be practical given the required thermal insulation properties.

This can be addressed by providing a thermal insulation layer which comprises at least one void. The voids can be holes or pockets of air, another gas, or vacuum within the body of the temperature control device. As the thermal conductivity of air or vacuum can be relatively high compared to solid insulator materials, providing some voids can allow the thermal resistance in the in-plane and cross-plane directions to be controlled more carefully than is possible in a layer of a solid material.

In one example, the voids can extend substantially perpendicular to the substrate, with other portions of the thermal insulation layer made from a solid insulator material. For example, the thermal insulation layer may comprise one or more pillars of a first thermal insulation material extending substantially perpendicular to the plane of the substrate in the area of the active thermal site between the heating element and the substrate, and the voids may be disposed between or around the pillars. The voids and pillars may have a wide variety of shapes, and could pass through the entire thickness of the insulating layer, or only partially through part of the thickness. By providing voids and pillars which extend substantially perpendicular to the plane of the substrate, this can allow relatively efficient heat transfer in the direction perpendicular to the plane of the substrate (since heat can pass more easily through the more conductive pillars), but it can be more difficult for heat to flow laterally towards the passive cooling regions, because lateral heat flow would require crossing of one or more voids of air, gas or vacuum. The fill ratio (fraction of the total area taken up by the pillars or voids) can be varied to provide different ratios between the in-plane and cross-plane thermal resistance, to give precise control over the bias point for heating/cooling.

On the other hand, other examples may provide a thermal insulation layer which comprises a void extending substantially throughout the entire area of the active thermal site between the heating element and the substrate. Hence there may not be any need for any pillars. The thermal insulation layer could essentially comprise a layer made entirely of gas or vacuum (other than some solid bounds at the edge of the active thermal site).

Manufacturing of the device including a layer with voids can be achieved by forming the one or more voids within a device layer provided at a first surface of a primary wafer, and bonding the first surface of the primary wafer to a secondary wafer for supporting other elements of the thermal control device such as the heating element of each active thermal site and at least part of the thermal conduction layer of each passive thermal region. The voids could be formed either before or after the bonding of the primary and secondary wafers. Hence, by bonding primary and secondary wafers, it is possible to form voids within the body of the temperature control device.

However, where the thermal insulation layer comprises pillars and voids, the pillars can be formed in the device layer of the primary wafer prior to bonding it with the secondary wafer, and after bonding the primary wafer and the secondary wafer, the voids can be formed by etching away portions of the device layer between the pillars from an opposite side of the device layer to the first surface. For example, the first thermal insulation material may comprise an oxide (e.g. silicon dioxide), and the pillars may be formed in the device layer by etching holes in the device layer and oxidising material of the device layer at the edges of the holes to define the walls of the pillars. The primary wafer may comprise a buried oxide layer at an opposite side of the device layer from the first surface, and after bonding the primary wafer and the secondary wafer, the primary wafer can be etched back to the buried oxide layer, holes can be etched in the buried oxide layer at locations of the voids, and then parts of the device layer can be etched away via the holes in the buried oxide layer to form the voids. The holes in the buried oxide layer can then be filled by depositing more oxide to cover the holes. This approach allows the pillared structure to be manufactured using available silicon CMOS and silicon MEMS industrial processes. With this approach, the thickness of the device layer between the first surface and the buried oxide layer of the primary wafer will determine the height of the pillars in the thermal insulation layer, and the size of the holes etched into the primary wafer determines the size of the pillars and hence the fill ratio of pillars to voids. The size of the etch holes can be varied using a mask, allowing careful control over the ratio between the thermal resistances in the directions perpendicular and parallel to the plane of the substrate.

The temperature control device may comprise a cooling mechanism to cool the substrate to act as a heat sink. Alternatively the temperature control device may be provided without a cooling mechanism, and an external cooling mechanism can be used (e.g. the temperature control device can be placed with the substrate in contact with a cooling device to maintain the substrate at a given temperature), or the substrate could simply be held at room temperature. In general, the temperature of the substrate limits the lowest temperature that can be controlled at the active thermal sites, so depending on the particular application different amounts of cooling may be required.

While the temperature control device can be used to heat sites in a solid surface (e.g. for semiconductor temperature control) or in a static fluid, it is particularly useful for controlling the temperature at various sites within a flowing fluid. Hence, the temperature control device may comprise a fluid flow control element for controlling flow of the fluid over the plurality of active thermal sites and the one or more passive thermal regions. For example, for supporting chemical reactions, the flow of fluid may supply reagents for the reactions, and as the reagent flows over the various active thermal sites and passive thermal regions, it can be heated or cooled to desired temperatures suited to the reactions at each site. For example, the temperature can be used to control whether a reaction at a given site is triggered.

In one example, the active thermal sites may be disposed in one or more rows oriented substantially parallel to the direction of fluid flow controlled by the fluid flow control element. Each row may comprise two or more active thermal sites with a passive cooling region disposed between each pair of adjacent active thermal sites of the row. Disposing the sites in rows can make manufacture of the device more straightforward. In particular, if there are two or more rows, the active thermal sites can be arranged in a matrix structure, which can simplify addressing of individual sites for routing control signals to each site and reading out the temperatures measured at each site (e.g. a row/column addressing scheme can be used).

Hence, when fluid flows across the temperature control device, a given part of the fluid will flow along one of the rows which are oriented parallel to the fluid flow direction. That part of the fluid will encounter a given active thermal site, where it is heated or cooled to a given temperature, then flow over a passive site where it is subject to cooling, then encounter another active thermal site where it can be heated or cooled to a different temperature to the first active thermal site, and so on as it passes along the row. Each active thermal site may have a length along the row direction that is greater than a length along the row direction of each passive cooling region disposed between adjacent active thermal sites of the row. Making the active thermal sites longer than the intervening passive regions allows for more efficient use of the total area of the substrate (and hence greater number of control sites per unit area), as for the active thermal sites once the fluid has been brought to the desired temperature the fluid should remain at that temperature for some time to enable the reactions to take place, but when the fluid passes over the passive sites the only function is cooling (not supporting reactions), and so provided there is enough gap between active sites to provide sufficient cooling before the fluid reaches the next active site, there is no need for the temperature to remain constant within part of the passive regions. Hence, by making the passive regions smaller than the active regions, more reaction sites can be fitted within a given amount of space.

In some embodiments each active thermal site may include a reaction surface at the surface in contact with the medium. For example, the reaction surface could be made of gold, which can provide a neutral platform for many chemical or biological reactions.

A method for precisely controlling the temperature within spatially localised regions, 'virtual wells', of an extended body of flowing or static fluid is described. We achieve temperature control by a combination of passive cooling and resistive heating, allowing fast bidirectional control of the temperature within the virtual wells. In order to efficiently control the temperature and allow a wide range of liquid temperature, we both engineer the heat flow within the heater substrate chip and also develop a heat flow model that enables feedback control of the temperature.

For many chemical or biological processes, it can be useful to control chemical reactions at specific locations within a fluid. The rate at which chemical reactions occur is exponentially sensitive to temperature, enabling the ability to thermally control reaction rates. In order to achieve spatial control of thermally controlled chemical reactions, we describe a two-dimensional matrix of thermal sites (see FIGS. 1 and 2). To achieve bidirectional control over the temperature within the fluid, it is required both to pump heat into and out of the fluid. Here, we implement this bidirectional control of heat by using two species of thermal site, one whose primary purpose is to transfer heat into the fluid and the other whose primary purpose is to transfer heat out of the fluid.

Figure 2:
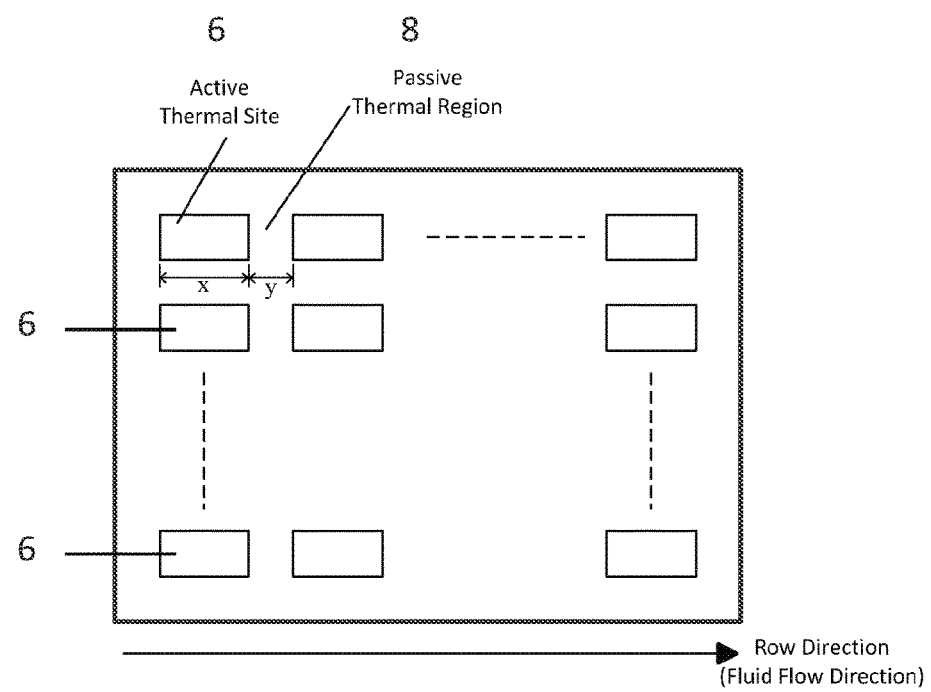
FIG. 2 shows a top view of the temperature control device.

FIG. 1 shows an example of a temperature control device 2 for controlling temperatures at respective sites in the medium. A fluid flow element (e.g. a pump) is provided to control the flow of fluid through a fluid flow path 4 across the top of the temperature control device 2. A number of active thermal sites 6 are provided at various locations across the plane of the temperature control device 2. The top of each active thermal site 6 may include a reaction surface (e.g. a gold cap) on which reactions can take place. Each active thermal site 6 includes a heating element to apply heat to the corresponding part of the fluid flowing over that site, to control the temperature of the fluid. As shown in FIG. 2, the active thermal sites 6 are arranged in a two-dimensional matrix (grid), arranged in two or more rows where the row direction is parallel to the direction that fluid flows through the fluid flow path 4. The regions lying between the active thermal sites 6 form one or more passive thermal regions 8 which do not comprise any heating element, but provide passive cooling by conducting heat away from the fluid towards the substrate 10 of the device 2. The length x of each thermal site 6 in the row direction is longer than the length y of each passive thermal region 8 lying between a pair of adjacent active thermal sites 6 in the same row. As shown in FIG. 1, a cooling mechanism 12 may be provided to cool the substrate 10 to act as a heat sink.

In principle, the same thermal site could both transfer heat into the fluid and transfer heat out of the fluid. For example, this could be achieved by a thermoelectric element, capable of bidirectional heat pumping. However, the approach described here defines two separate species of thermal site, which we refer to as active and passive sites 6, 8. A desirable attribute of the separated active and passive sites is that they can be fabricated by standard semiconductor processing techniques and by using materials available within that industry.

Figure 3:
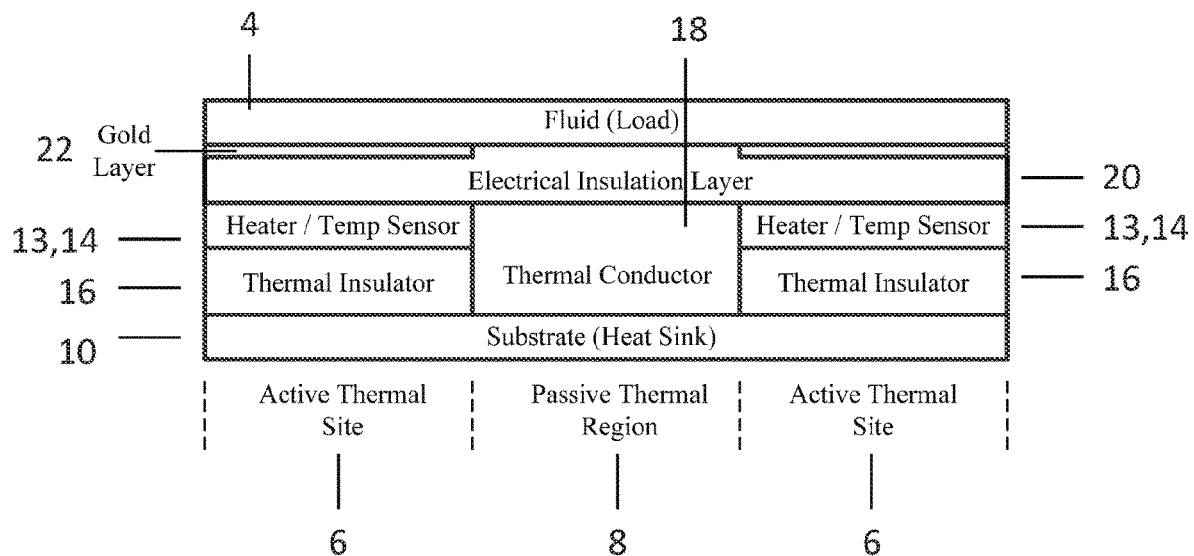
FIG. 3 shows a cross-section through the temperature control device in more detail.

FIG. 3 shows a cross-section through the temperature control device 2 in more detail (FIG. 3 is schematic and is not intended to be to scale). The active thermal site 6 includes a heater 13 and thermometer (temperature sensor) 14. The heater 13 is operated under closed-loop control, with its output power set to maintain a certain temperature in the fluid above the site. The thermometer 14 in the active site provides the measurement for closed-loop control. Though the active site is primarily used to heat the fluid, at small heater powers, it is also capable of a small (relative to its ability to heat) amount of cooling, due to heat flow to the substrate 10. A thermal insulation layer 16 is provided between the heater 13 and the substrate 10 to control the amount of heat lost to the substrate 10. On top of the active site, the fluid is in contact with either an electrical insulator 20 or a gold pad 22, placed on the electrical insulator.

By contrast, the passive site 8 does not operate under closed-loop control and is responsible for transferring heat out of the fluid to a heat-sink at or underneath the substrate 10: the main role of the passive site is to act as a good thermal conductor. Hence, the passive region 8 includes a thermal conduction layer 18 for conducting heat from the fluid to the substrate 10. The temperature of the substrate 10 is maintained by a separate cooling mechanism 12 and can be assumed to be at a constant value. The passive sites are also covered by an electrically insulating region 20. The thermal conduction layer 18 of the passive site 8 has a lower thermal resistance in the direction perpendicular to the plane of the substrate than the thermal insulation layer 16 in the active site 6.

It will be appreciated that additional layers could also be included in the device 2 that are not shown in FIG. 3. For example, a heat spreading layer could be provided to spread heat from the heater 13 across the active thermal sites, to provide more uniform application of heat to the corresponding site.

As a fluid element moves over the surface of the chip 2, it passes, in an alternating fashion, over active and passive sites 6, 8. Over the active site, heat flows into the fluid and the temperature of the fluid element gets set to a desired 'hot' value. A short time later it passes over a passive site and the heat now flows out to the heat sink, leaving the fluid element at a 'cold' temperature. The fluid element then passes onto the next active site, and so on.

Figure 4:
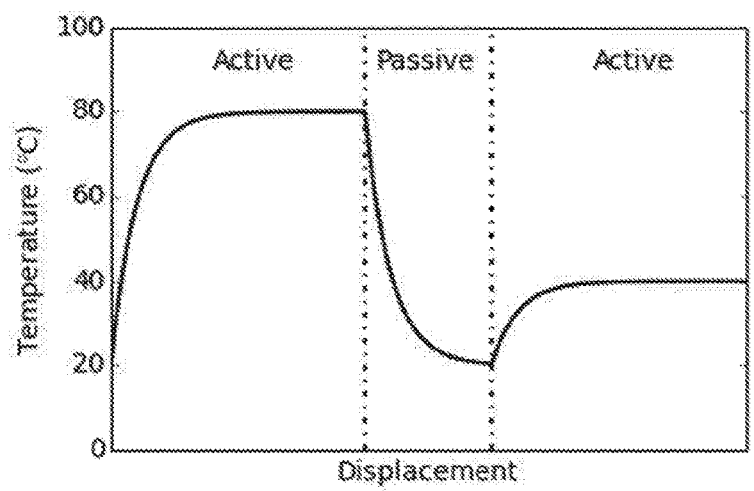
FIG. 4 is a graph showing an example of changes in temperature in a fluid as it flows over active thermal sites and passive thermal regions of the temperature control device.

Hence, we include the passive thermal sites to pre-cool the fluid entering each active site, assuming that it is impractical for a resistive heater based active site to have commensurate cooling and heating ability. The passive sites 8 have the role of conducting heat away from the fluid, so that the fluid entering the space above an active site is close to the heatsink temperature. To illustrate the behaviour of the combined active and passive sites FIG. 4 shows a sketch of the temperature above an active-passive-active sequence. The leftmost active site pumps heat into the fluid, increasing its temperature to a maximum value of 80° C. Then as the fluid passes over the passive site it cools down towards 20° C. And finally as the fluid passes the rightmost active site heat flows in, and its temperature increases to 40° C. While these temperatures are arbitrary they are representative of operating conditions. As shown in FIG. 2, the active sites may have greater spatial extent than the passive sites (length x>length y). While the active sites provide a region of constant temperature for chemical reactions to take place, the only requirement of the passive sites is that they cool the fluid entering the active sites. This pre-cooling reduces the cooling requirement of the active sites, enabling them to more efficiently transfer heat into the fluid.

Figure 5:
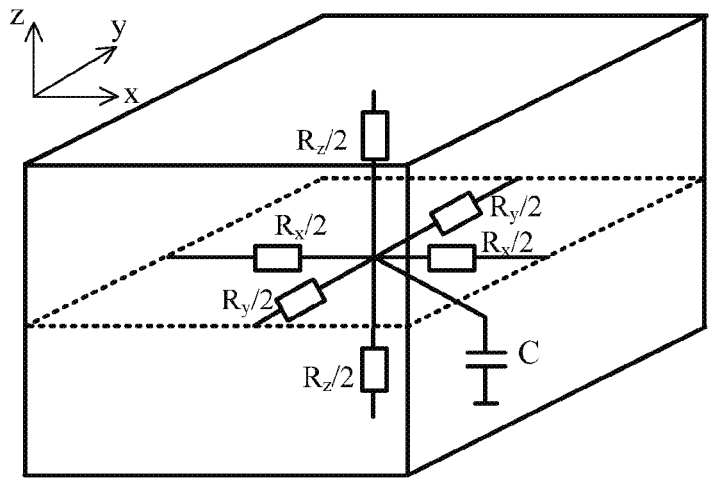
FIG. 5 illustrates a thermal model for an active thermal site.

In order to design the thermal properties of the active and passive sites we describe the system by a thermal model. Here, we develop an electrical analogy in which the thermal resistances are replaced by electrical resistances; the heat capacity by capacitors; and temperature by voltage. To discretise the structure, and enable the construction of an electrical circuit, we divide it into blocks as shown in FIG. 5. A block may consist of an active or passive thermal site or a block of fluid above one of these sites.

Figure 6:
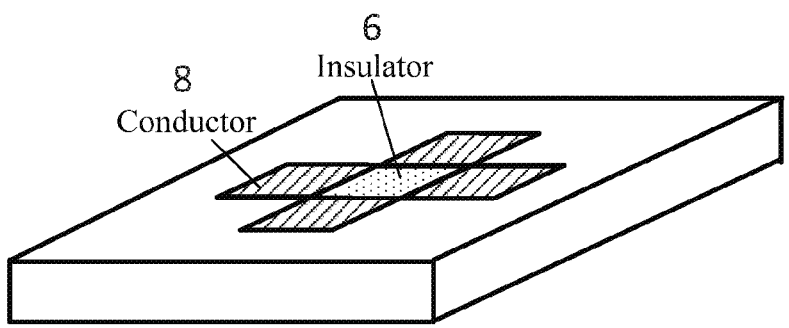
FIG. 6 illustrates a first order approximation of the system as an active thermal site surrounded by four passive thermal regions.
Figure 7:
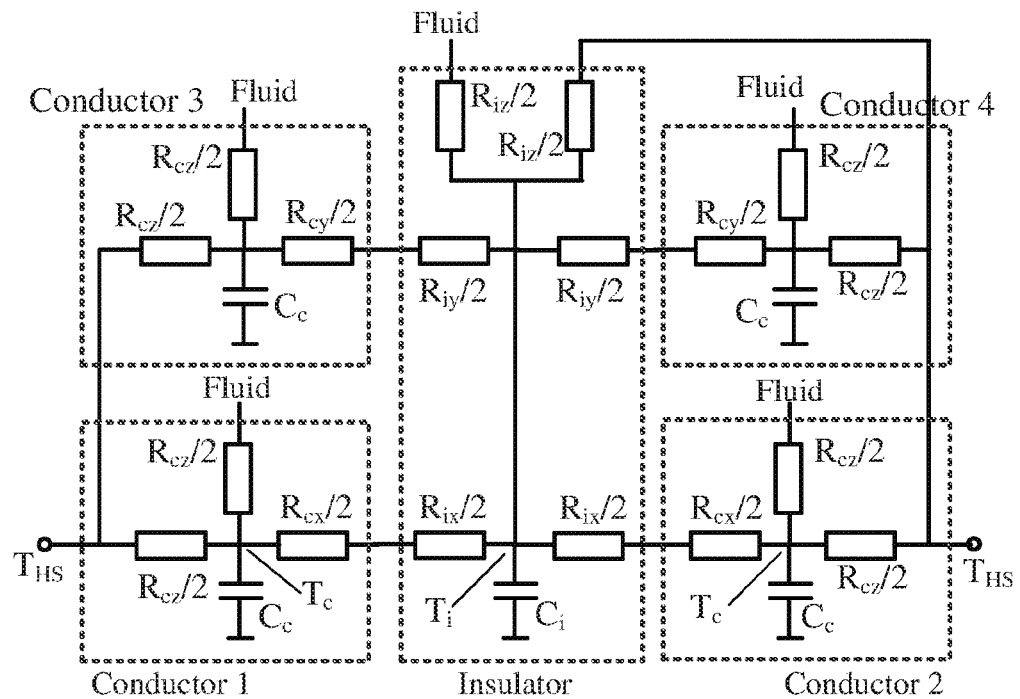
FIG. 7 shows an electrical circuit model analogous to the thermal model.

As a first order approximation of our system, we consider each active site to be surrounded by 4 passive sites (FIG. 6). By describing each active and passive site as a single thermal block, it is possible to draw a circuit diagram that describes an electrical model of the thermal behaviour of an active site (FIG. 7), where "conductor" or "conductive site" refers to the passive thermal region 8 and "insulator" or "insulating site" refers to the active thermal site 6, and:

$C_c$ and $C_i$—Heat capacity of the conductor and insulator respectively $R_{cx}$, $R_{cy}$, $R_{cz}$—Thermal resistances of the conductor in x, y, z directions (where z is the direction perpendicular to the plane of the substrate 10 and x and y are orthogonal directions parallel to the plane of the substrate)

Figure 8:
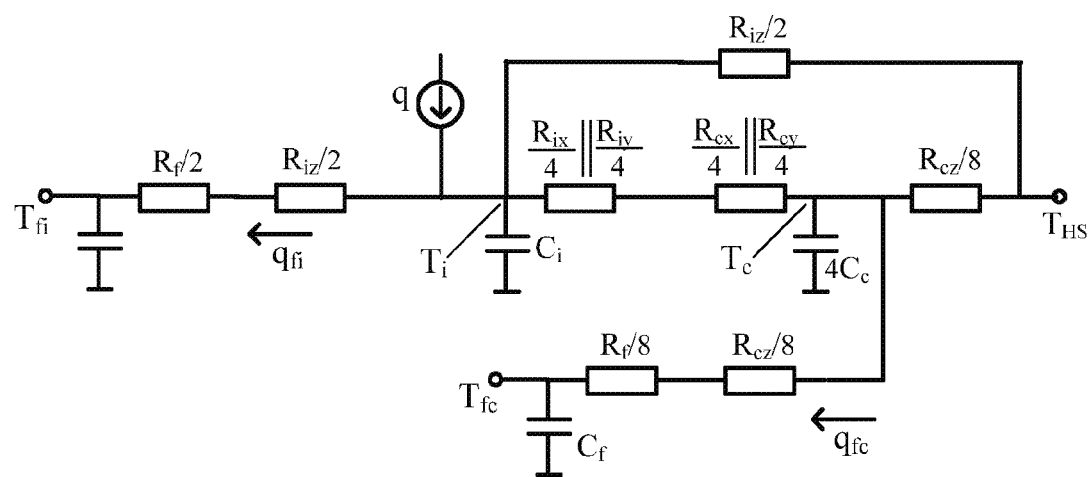
FIG. 8 shows a compacted version of the model of FIG. 7.

$R_{cx}$, $R_{cy}$, $R_{cz}$—Thermal resistances of the insulator in x, y, z directions $T_{HS}$—Temperature of the heat-sink $T_c$ and $T_i$—Temperature of conducting and insulating sites Due to the symmetry of the physical structure and because of the isothermal substrate, we consider equal heat flow from the insulating region to the four conducting regions, enabling them to be considered together. In FIG. 8 we show a compacted thermal model, including this simplification, where we also include a heat flow or heat current (q) generated by the heater.

q—Heat current generated by the heater.

$q_{fc}$, $q_{fi}$—Heat current absorbed by the fluid through the conducting site and insulating site respectively.

$C_f$—Thermal capacity of a block of fluid. It has a volume given by the area of the conducting (or insulating) site and height of the fluid, $h_f$.
$R_f$—Thermal resistance of a block of fluid. It has a volume given by the area of the conducting (or insulating) site and height of the fluid, $h_f$.
$T_{fc}$, $T_{fi}$—Temperature of the fluid above the conducting and insulating sites respectively.

Using the electrical model of the thermal circuit, we can determine the heat flow from the insulating site into the fluid, $q_g$. Taking the circuit in FIG. 8, we simplify the resistances as:

$$R_1 = \frac{R_{ix}}{4} \left\| \frac{R_{iy}}{4} + \frac{R_{cx}}{4} \right\| \frac{R_{cy}}{4}$$

$$R_2 = \frac{R_{cz}}{8} + \frac{R_f}{8}$$

$$R_3 = \frac{R_{cz}}{8}$$

where ∥ is shorthand for the equivalent combined resistance to the parallel resistances, e.g.

$$\frac{R_{ix}}{4} \left\| \frac{R_{iy}}{4} = \frac{1}{\frac{4}{R_{ix}} + \frac{4}{R_{iy}}} \right.$$

Since the thermal current through $R_1$ is the sum of thermal currents into $R_2$ and $R_3$:

$$\frac{T_i - T_c}{R_1} = \frac{T_c - T_{fc}}{R_2} + \frac{T_c - T_{HS}}{R_3}$$

Therefore, we are able to write the thermal current ($q_1$) passing through $R_1$ as:

$$q_1 = \frac{T_i - T_c}{R_1} = \frac{T_i - R_1\|R_2\|R_3\left[\frac{T_i}{R_1} + \frac{T_{fc}}{R_2} + \frac{T_{HS}}{R_3}\right]}{R_1}$$

$$R_1\|R_2\|R_3 = \frac{1}{\frac{1}{R_1} + \frac{1}{R_2} + \frac{1}{R_3}}$$

We know the temperature $T_i$, because we measure it with a temperature sensor, and we can calculate the heat flow from the insulator into the fluid, $q_{fi}$.

$$q_{fi} = q - \frac{T_i - T_{HS}}{\frac{R_{iz}}{2}} - \left\{ \frac{T_i - R_1\|R_2\|R_3\left[\frac{T_i}{R_1} + \frac{T_{fc}}{R_2} + \frac{T_{HS}}{R_3}\right]}{R_1} \right\}$$

Due to the relatively low thermal conductivity of fluid ($k_f$=0.6 W/m/K) compared to silicon ($k_{Si}$=130 W/m/K) the thermal resistance of the conductor to the heat sink is much lower than the thermal resistance of the conductor to the fluid. Hence, $$R_2 \gg R_3$$

With this assumption, the heat flow from the insulator into the fluid becomes:

$$q_{fi} = q - \frac{T_i - T_{HS}}{\frac{R_{iz}}{2}} - \left\{ \frac{T_i - R_1\|R_3\left[\frac{T_i}{R_1} + \frac{T_{HS}}{R_3}\right]}{R_1} \right\}$$

Figure 9:
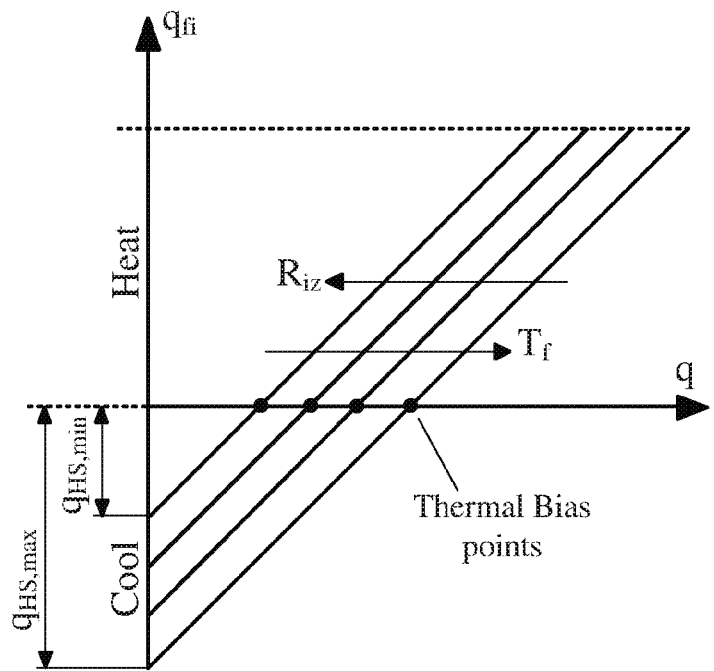
FIG. 9 shows how the heat supplied to the medium varies with the heat generated by the heating element.

FIG. 9 plots heat flow into the fluid ($q_{fi}$), for several constant values of fluid temperature. In the case of zero heat output by the heater (assuming that $T_f > T_{HS}$), the heat flow from the insulator into the fluid ($q_{fi}$) is negative: i.e. the active site cools the fluid. The maximum amount of cooling provided by the active site is tuned by the thermal resistance $R_{iz}$ of the thermal insulation layer 16 between the active site and the heat sink in the direction perpendicular to the plane of the substrate, and therefore that resistance $R_{iz}$ is a key design parameter for the active site. As shown in FIG. 9 the bias point where the heat q from the heater exactly counteracts the loss of heat to the substrate 10 and surrounding passive regions 8 decreases with increasing insulator thermal resistance $R_{iz}$. Hence, the insulator resistance $R_{iz}$ can be tuned to change the balance between heating and cooling at the active thermal sites 6.

The minimum available cooling power, which occurs when the heater is off and the temperature of the fluid is at a minimum, is set by the heatsink temperature and the thermal resistance of the site. However, unless the heatsink temperature is held at unrealistically low values, the amount of heat flowing through the site increases with the temperature of the fluid, i.e. $q_{HS,max} \gg q_{HS,min}$. This inefficiency ultimately limits the cooling power that can be applied by the active site, because of the finite capacity of the heatsink to remove the waste heat. This is why providing the passive sites for pre-cooling the fluid between active sites enables more efficient heating and a larger temperature range for a given amount of heater power.

As discussed in the previous section, the thermofluidic chip described here has intrinsic non-linearity caused by the variable temperature of the fluid above the active sites. Hence we describe a thermal control system (see FIG. 10), which includes a non-linear control function ("linearizer") in order to achieve the necessary temperature control. In this way, the electrical current passing through the heater 13 can be controlled in order to maintain a constant temperature in the fluid.

Figure 10:
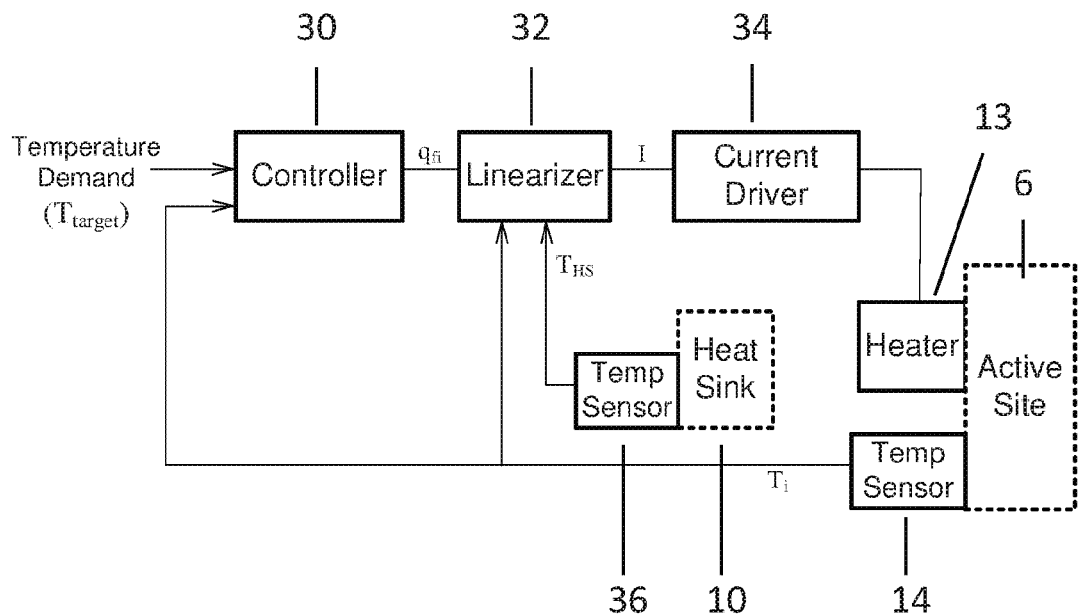
FIG. 10 shows a feedback loop architecture for controlling the temperature at a given active site.

FIG. 10 shows the feedback loop for a single active site 6. Each active site 6 may have a separate instance of such a feedback loop. The target temperature $T_{target}$ is input to a controller 30 which also receives the temperature $T_i$ measured by the temperature sensor 14 of the corresponding active site. The controller 30 determines the target amount of heat $q_{fi}$ to be supplied by the active site 6 to the fluid based on a transfer function of the form $C(S) \cdot (T_{target} - T_i)$, where C(s) is a transfer function whose poles and zeros have been placed according to classical control theory.

A linearizer 32 comprises mapping circuitry which maps the target amount of heat $q_{wi}$ supplied by the controller 30 to an input signal I defining the amount of current to be supplied by a current driver 34 to the heater 13, in dependence on $T_i$ and $T_{HS}$, the temperature of the substrate 10. The substrate temperature $T_{HS}$ can be measured by a single sensor 36 shared between all active sites 6 or by individual sensors local to each active site 6. The linearizer 32 provides a non-linear mapping function which enables the controller 30 to use a linear transfer function (hence the term "linearizer"). The non-linear function provided by the linearizer 32 may be a function representing an analytic inversion of the thermal model. From the model described above, the total power generated into the heater to achieve the demanded temperature into the fluid is:

$$q(q_{fi}, T_i, T_{HS}) = q_{fi} + \frac{T_i - T_{HS}}{\frac{R_{iz}}{2}} + \left\{\frac{T_i - R_1 \parallel R_3 \left[\frac{T_i}{R_1} + \frac{T_{HS}}{R_3}\right]}{R_1}\right\}$$

The electrical current necessary for the heater to reach a certain temperature is:

$$I = \sqrt{\frac{q}{r}},$$

where r is the electrical resistance of the heater.

Combining the two previous equations, we get the form of the linearizer, which converts heat demand into required current:

$$I = \sqrt{\frac{q_{wi} + \frac{T_i - T_{HS}}{\frac{R_{iz}}{2}} + \left\{\frac{T_i - R_1 \parallel R_3 \left[\frac{T_i}{R_1} + \frac{T_{HS}}{R_3}\right]}{R_1}\right\}}{r}}$$

Figure 11:
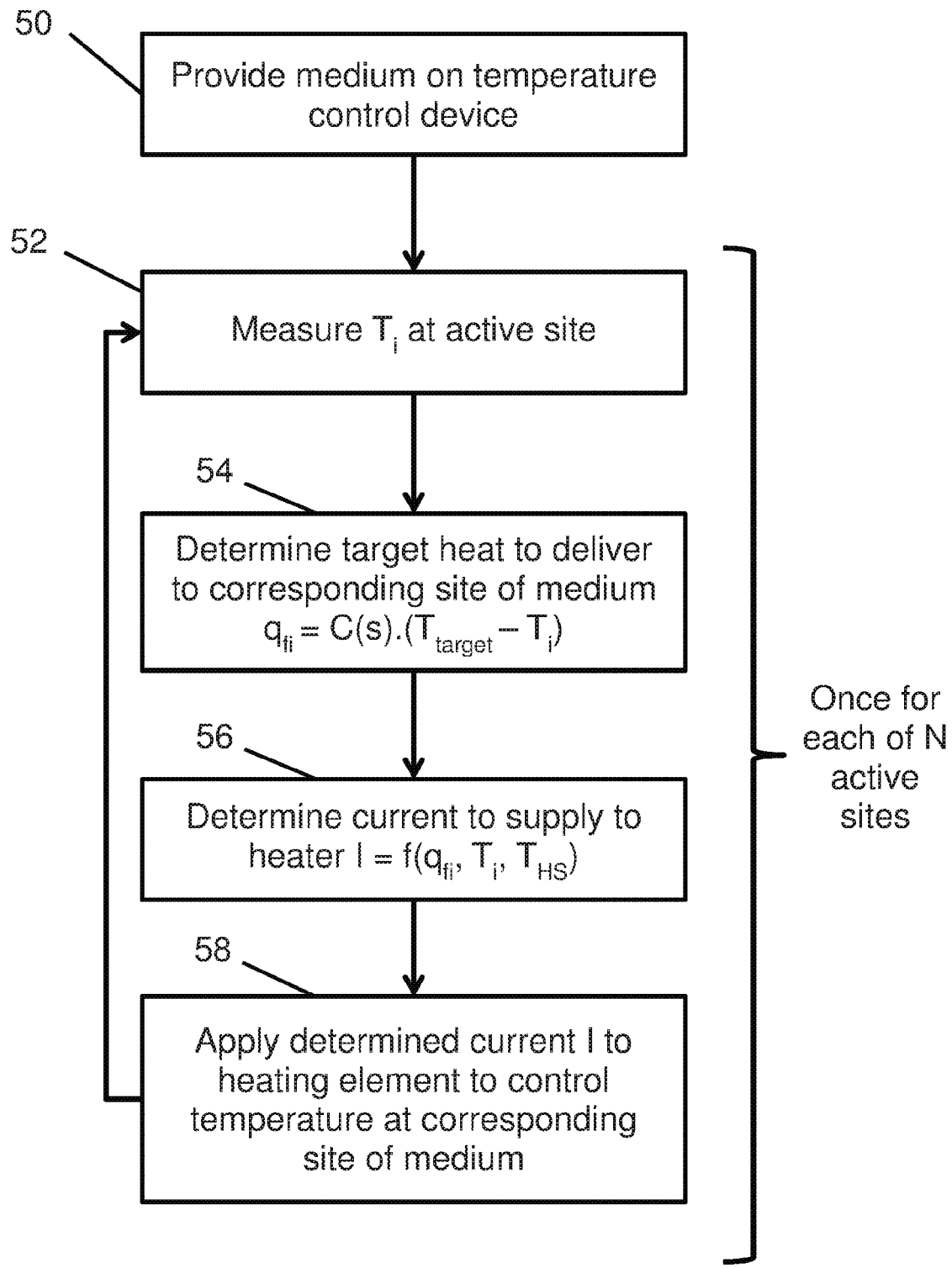
FIG. 11 is a flow diagram illustrating a method of controlling temperatures at respective sites in a medium.

FIG. 11 is a flow diagram illustrating the temperature control method. At step 50 the medium in which the temperature is to be controlled is provided on the temperature control device. For example, the medium can be a fluid flowing over the temperature control device. At step 52, the temperature $T_i$ is measured at an active thermal site 6. At step 54 the target amount of heat to be delivered to the corresponding site of the medium is determined according to $q_{fi}=C(s).(T_{target}-T_i)$. At step 56 the current to be supplied to the resistive heater 13 is determined according to $I = f(q_{fi}, T_i, T_{HS})$ where f is the function representing the linearizer equation shown above. At step 58 the determined amount of current I is supplied to the heating element 13 by the current driver 34 to control the temperature at the corresponding site of the medium. The method then returns to step 52 to continue to control the temperature at the site based on the measured temperature $T_i$ and target temperature $T_{target}$, taking into account the heat flow from the active site 6 to regions other than the medium itself according to the thermal model discussed above. Steps 52 to 58 are performed N times in parallel, once for each active site in the temperature control device 2.

To achieve temperature control of the active site, the required thermal resistances of the active and passive regions 6, 8 are determined, so that suitable materials and geometries can be chosen. There are two conditions which a 3D block of an active site should meet:

1—The power generated by the heater should mostly heat the fluid, and only a small fraction should leak vertically into the heat-sink i.e. the active site should have a high thermodynamic efficiency, η.

$$\eta = \frac{q_{fi}}{q}$$

2—The power generated by the heater should not flow horizontally towards other thermal sites i.e.

$$R_z \ll \frac{R_x}{4} \parallel \frac{R_y}{4}$$

This inequality can be satisfied either by using a thin film material for the thermal insulation layer 16 of an active site (such that z<<x,y, where z is the thickness in the direction perpendicular to the plane of the substrate and x, y are the in-plane length/width of the thermal insulation layer) or by use of an anisotropic thermal material, which is more thermally conductive in the direction through the thickness of the substrate than along the plane of the substrate ($k_z >> k_x$, $k_y$).

We invoke this second requirement mainly to simplify a model for the heat flow, enabling a linearizer function to be simply determined. It would also be possible to design the active site for the other limit, in which there is no vertical transport of heat from the active site into the heat-sink. The reason that we consider the vertical transport limit is that it gives a better knowledge of the heat flow into the fluid. In the horizontal transport limit, there is an additional region of the chip's surface, with a temperature gradient, from which heat can flow into the fluid.

There are a number of materials out of which one could fabricate an active site but, as an example, let's consider $SiO_2$, a common material with a low thermal conductivity ($k_{SiO2}=1.3$ W/m/K). The thermal resistance for the active site material in the z-direction can be expressed as a function of the maximum heat leaking to the heat sink:

$$R_{iz} = \frac{T_{i,max} - T_{HS}}{q_{HS,max}} = \frac{1}{k_z} \cdot \frac{z}{xy}$$

From this we can deduce the required height of material:

$$z = \frac{xyk_z(T_{i,max} - T_{HS})}{q_{HS,max}}$$

It remains to determine the maximum acceptable heat leakage to the heat sink, $q_{HS,max}$. For a rectangular active site of dimension 100 μm×200 μm, we assume a maximum heater power of 6 mW. At maximum heater power, we allow half of the power to go to the heatsink. Furthermore we assume a maximum fluid temperature of $T_{f,max}=90$ C, a heat sink temperature of $T_{HS}=10$ C and that the temperature of the thermal site is approximately the same as the temperature of the fluid ($T_{f,max} \approx T_{i,max}$). If all the material of the active site is made from $SiO_2$, a material with isotropic thermal conductivity, then its height would need to be ≈700 μm. For such a block, the thermal resistance in the vertical direction is $R_{iz} \approx 27,000$ K/W. Such a block, for which z>x,y, does not satisfy the second condition of small heat leakage between thermal sites.

Figure 12:
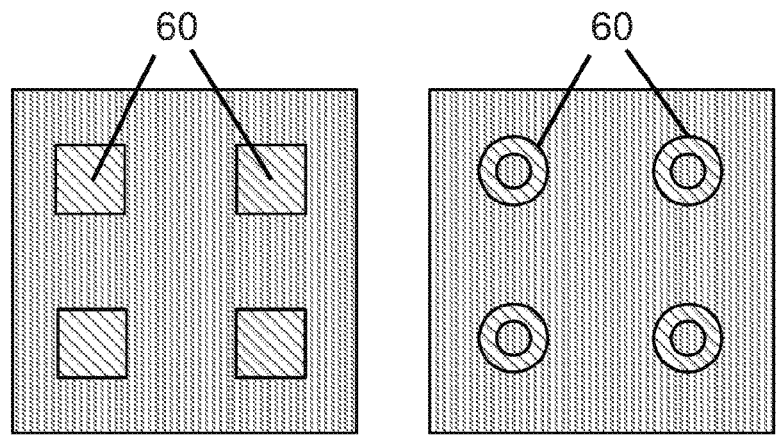
FIG. 12 illustrates examples of a pillared structure for the thermal insulation layer of an active site.

One way to satisfy the condition for small heat leakage between sites is to, by patterning, make the active site material thermally anisotropic. For example, one can produce a structure where vertical pillars of SiO₂ are separated by spaces of air ($k_{air}$=0.024 W/m/K). The required vertical height of the material, in this case the height of the pillars, is multiplied by the pillar fill factor. For example, with a fill-factor of 10% the pillar height becomes 70 μm. The insulating pillars may take a number of different geometries, several examples of which are shown in FIG. 12. The pillars 60 are surrounded by voids comprising air, gas or vacuum. In other examples the pillars could enclose the voids.

By providing a pillared structure comprising pillars extending in the direction perpendicular to the substrate and voids around or between the pillars, we maintain the same thermal resistance in the vertical direction ($R_{iz}\approx$27,000 K/W) but it is clear that the lateral resistance is reduced, mainly because $k_{air} < k_{SiO2}$ but also because of the lower height of the active material.

Calculating the lateral thermal resistances for a 10% fill-factor we find that:

$$\frac{R_x}{2} \approx \frac{y}{2k_{air}xz}, \frac{R_y}{2} \approx \frac{x}{2k_{air}yz}$$

This gives a total lateral thermal resistance of:

$$\frac{R_x}{4} \| \frac{R_y}{4} = 60{,}000 \text{ K/W}$$

Note that the lateral thermal resistance can be further increased by reducing the pillar height, and simultaneously reducing the fill-factor. Alternatively, the silicon pillars can be separated by vacuum, providing a significant further increase in lateral resistance.

However, as the lateral thermal resistance in the bulk of the active material becomes large, it becomes important to consider the lateral thermal resistance of the capping layer. For example, a 2 μm thick silicon dioxide capping layer gives a contribution to the total lateral thermal resistance of:

$$\frac{R_x}{4} \| \frac{R_y}{4} = 38{,}000 \text{ K/W}$$

In summary, patterning a thermal insulator to consist of insulating pillars separated by air (or vacuum) provides a method of satisfying the thermal conditions of an active site. The limit of this case (where fill-factor goes to zero and the void covers the entire area of the active site) results in a free standing membrane which can be considered as an alternative approach to satisfying the thermal requirements.

Figure 13:
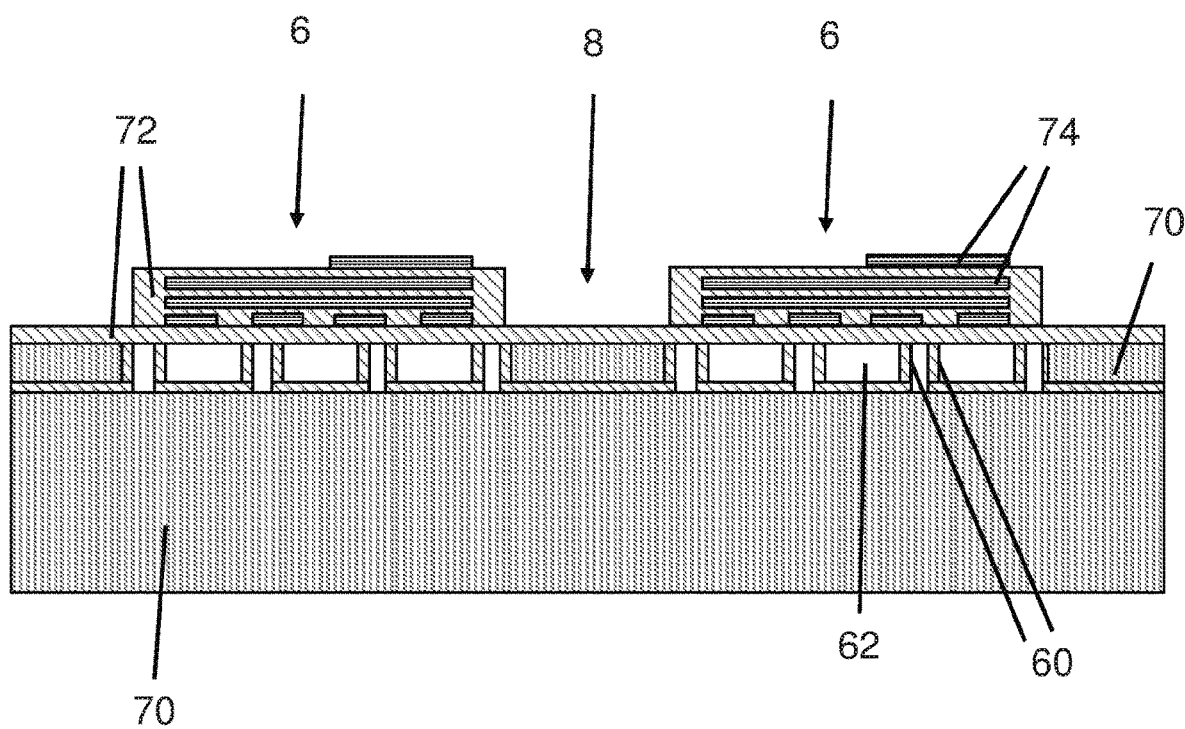
FIG. 13 illustrates a cross-section through two active sites and several passive sites, where the thermal insulation layer has a pillared structure including voids.

FIG. 13 shows how the pillared approach can be integrated into a complete device. The figure shows a cross-section through the device substrate, passing through two active and several passive thermal sites. Silicon 70 is shown using vertical hatching, silicon dioxide 72 using diagonal hatching, and the metal layers 74 are shown using horizontal hatching. The voids are shown in white. Note that the figure is not to scale, the upper layers are shown magnified in the vertical direction. Silicon provides a highly thermally conducting material for the substrate and is capable of being thermally oxidised in order to produce thermally insulating pillars 60 with voids 62 between the pillars. On top of the substrate containing the pillar structure there are a number of layers which contain the heater; a heat spreader (to evenly distribute the heat produced); a thermometer (to enable thermal control); and a surface capping layer.

Figure 14:
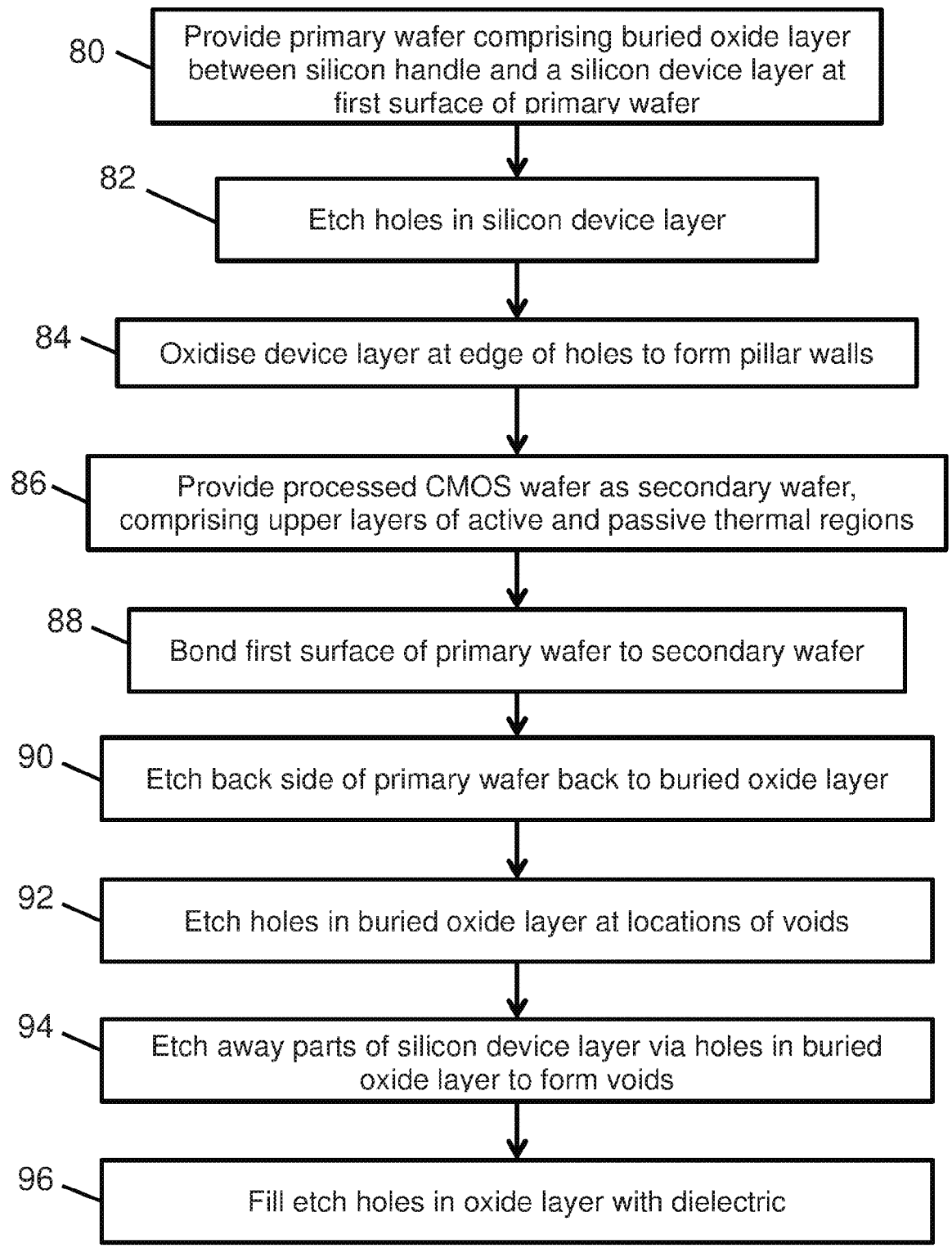
FIG. 14 is a flow diagram illustrating a method of manufacturing a temperature control device with a pillared thermal insulation layer.
Figure 15:
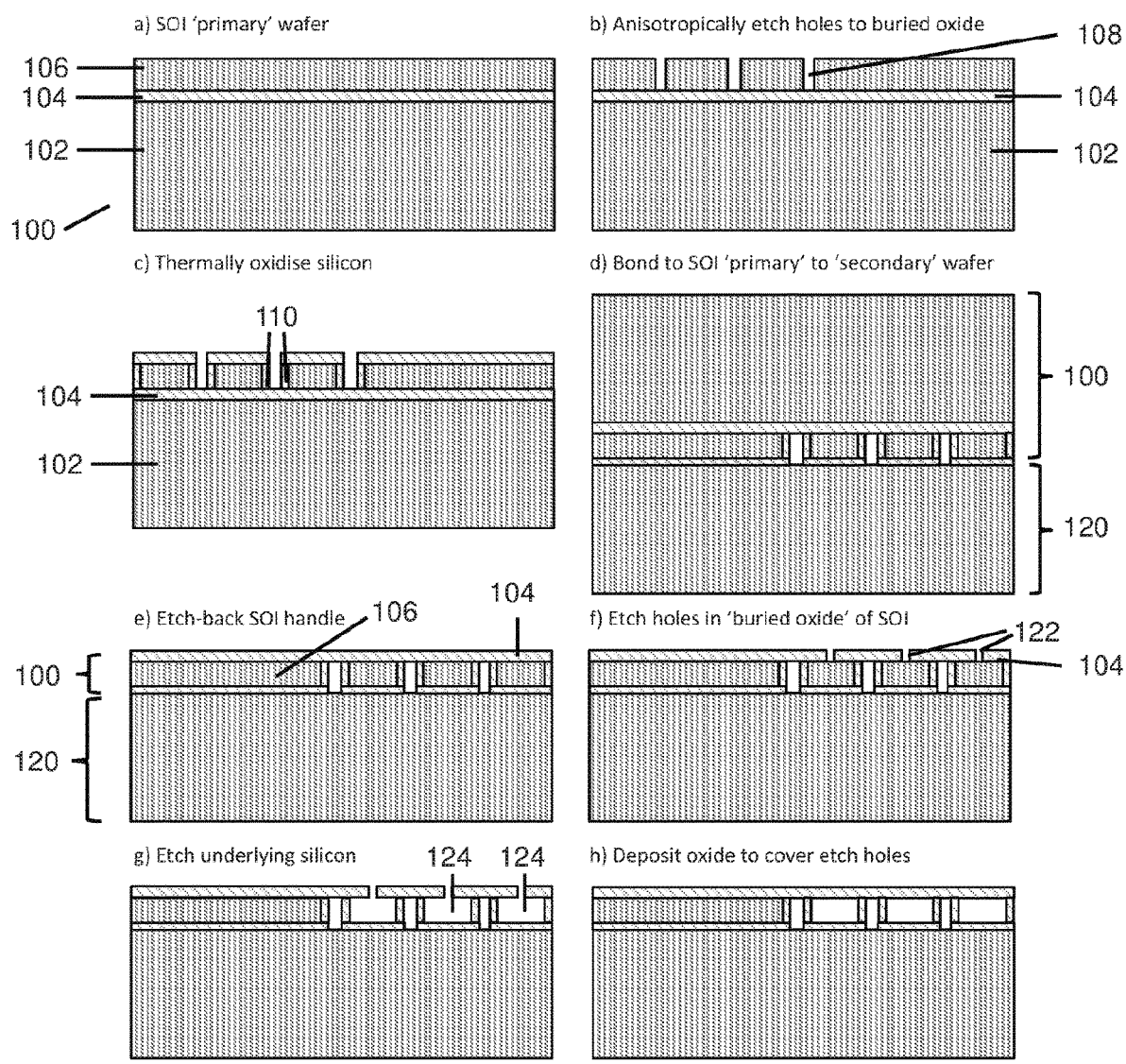
FIG. 15 illustrates the respective stages of the manufacturing method of FIG. 14.

The device 2 of FIG. 13 can be built using processes available to the silicon CMOS and silicon MEMS industries. FIGS. 14 and 15 show a process flow which achieves the required thermal resistances in the passive and active regions. At step 80 of FIG. 14 (part a of FIG. 15), the process starts with a silicon-on-insulator (SOI) wafer 100 comprising a relatively thick silicon handle 102, a buried oxide layer 104, and a silicon device layer 106. The thickness of the silicon device layer 106 gives the height of the silicon dioxide pillars and the thickness of the buried oxide is approximately 1 μm. Since a second wafer is later used in the processing, we refer to the SOI wafer as the 'primary'. The surface of the primary wafer 100 at which the device layer 106 is formed is referred to below as the 'first surface'.

At step 82 (part b of FIG. 15), the primary wafer 100 is photolithographically patterned and, using photoresist as an etch mask, the silicon device layer 106 is anisotropically etched down to the buried oxide 104 to form holes 108. In order to achieve the etching anisotropy, a deep reactive ion etch is used.

At step 84 (part c of FIG. 15), the wafer is oxidised, giving a thermal oxide with thickness of approximately 1 μm for example. The edges of the holes 108 are oxidised to form the walls of the silicon dioxide pillars 110.

At step 86 a secondary wafer 120 is provided. The secondary wafer 120 comprises a processed CMOS wafer, containing the electrically active and electrically passive devices needed for the heating and control functionality (e.g. the heater 13, temperature sensor 14, and upper parts of the thermal conductor layer of the passive sites 8). These metal layers and the devices within the secondary CMOS wafer 120 are not shown in FIG. 15 but can be provided as shown in FIG. 13.

At step 88 (part d of FIG. 15), the primary wafer 100 is turned upside down and the first surface of the primary wafer 100 is bonded to the secondary wafer 120. The wafer bonding could be achieved by thermo-compression bonding, in which case metal (e.g. gold) layers are needed on the surface of both the primary and secondary wafers.

At step 90 (part e of FIG. 15), the backside of the bonded primary wafer (the original handle layer 102 of the SOI wafer) is etched back to leave the buried oxide 104 of that SOI wafer 100 as at the top of the stack. After this step, metal tracks for the heater/thermometer/heat-spreader stack can be built on the secondary wafer 120 (not shown in FIG. 15).

Since the voids in the silicon device layer from the original SOI wafer still need to be removed, at step 92 (part f of FIG. 15), etch holes 122 are photolithographically patterned and etched in the top silicon dioxide layer 104. Then, in a subsequent process step 94 (part g of FIG. 15), an anisotropic dry etch (e.g. with XeF₂) of these silicon regions is performed, to form the voids 124 by etching away parts of the silicon device layer 106 via the etch holes 122 in the oxide 104. At step 96, the etch holes 122 in the oxide layer 104 are filled with dielectric (part h of FIG. 15), completing the processing of the active and passive thermal sites.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. A temperature control device for controlling temperatures at a plurality of sites of a medium, comprising:
    a plurality of active thermal sites disposed at respective locations on a substrate, each active thermal site comprising a heating element configured to apply a variable amount of heat to a corresponding site of said medium and a thermal insulation layer disposed between the heating element and the substrate; and
    one or more passive thermal regions disposed between the plurality of active thermal sites on the substrate, each passive thermal region comprising a thermal conduction layer configured to conduct heat from a corresponding portion of the medium to the substrate;
    wherein the thermal conduction layer of said one or more passive thermal regions has a lower thermal resistance in a direction perpendicular to a plane of the substrate than the thermal insulation layer of said plurality of active thermal sites;
    wherein the thermal insulation layer comprises one or more voids;
    the thermal insulation layer comprises one or more pillars of a first thermal insulation material extending substantially perpendicular to the plane of the substrate in the area of the active thermal site between the heating element and the substrate; and
    said one or more voids are disposed between or around the pillars.

2. The temperature control device according to claim 1, comprising control circuitry configured to control whether a selected active thermal site provides heating of the corresponding site of the medium using the heating element or cooling of the corresponding site by heat flow through said thermal insulation layer to said substrate, in dependence on whether an amount of heat generated by the heating element of said selected active thermal site is greater or smaller than a threshold amount.

3. The temperature control device according to claim 2, wherein the threshold amount is dependent on the thermal resistance of the thermal insulation layer in the direction perpendicular to the plane of the substrate.

4. The temperature control device according to claim 1, wherein each active thermal site comprises a temperature sensor configured to sense a temperature at the corresponding active thermal site.

5. The temperature control device according to claim 4, comprising a plurality of feedback loops each corresponding to a respective active thermal site;
    each feedback loop configured to implement a transfer function for determining a target amount of heat to be applied to the corresponding site of the medium in dependence on the temperature sensed by the temperature sensor of the corresponding active thermal site and a target temperature specified for the corresponding site of the medium.

6. The temperature control device according to claim 1, wherein the heating element comprises a resistive heating element.

7. The temperature control device according to claim 1, wherein the thermal insulation layer of said plurality of active thermal sites has a greater thermal resistance in a direction parallel to the plane of the substrate than in a direction perpendicular to the plane of the substrate.

8. The temperature control device according to claim 1, wherein the thermal insulation layer of a given active thermal site comprises a thin film material having a thickness z in the direction perpendicular to the plane of the substrate which is substantially smaller than a smallest dimension L of the thermal insulation layer of the active thermal site in a direction parallel to the plane of the substrate.

9. The temperature control device according to claim 1, comprising a cooling mechanism to cool the substrate to act as a heat sink.

10. The temperature control device according to claim 1, wherein the medium comprises a fluid, and the temperature control device comprises a fluid flow control element configured to control flow of the fluid over the plurality of active thermal sites and the one or more passive thermal regions.

11. The temperature control device according to claim 10, wherein the active thermal sites are disposed in one or more rows oriented substantially parallel to the direction of fluid flow controlled by the fluid flow control element;
    each row comprising two or more active thermal sites with a passive thermal region disposed between each pair of adjacent active thermal sites of the row.

12. The temperature control device according to claim 11, wherein each active thermal site has a length along the row direction that is greater than a length along the row direction of each passive thermal region disposed between adjacent active thermal sites of the row.

13. A method for controlling temperatures at a plurality of sites of a medium, comprising:
    providing the medium on a temperature control device comprising a plurality of active thermal sites disposed at respective locations on a substrate and one or more passive thermal regions disposed between the plurality of active thermal sites on the substrate;
    each active thermal site comprising a heating element configured to apply a variable amount of heat to a corresponding site of said medium and a thermal insulation layer disposed between the heating element and the substrate;
    each passive thermal region comprising a thermal conduction layer configured to conduct heat from a corresponding portion of the medium to the substrate; and
    the thermal conduction layer of said one or more passive thermal regions having a lower thermal resistance in a direction perpendicular to a plane of the substrate than the thermal insulation layer of said plurality of active thermal sites; and
    controlling the amount of heat applied by the heating elements of the plurality of active thermal sites to control the temperatures at said plurality of sites of the medium;
    wherein the thermal insulation layer comprises one or more voids;
    the thermal insulation layer comprises one or more pillars of a first thermal insulation material extending substantially perpendicular to the plane of the substrate in the area of the active thermal site between the heating element and the substrate; and said one or more voids are disposed between or around the pillars.

14. A method of manufacturing a temperature control device, comprising:

forming a plurality of active thermal sites at respective locations on the substrate and one or more passive thermal regions disposed between the plurality of active thermal sites on the substrate; wherein:

each active thermal site comprises a heating element configured to apply a variable amount of heat to a corresponding site of said medium and a thermal insulation layer disposed between the heating element and the substrate;

each passive thermal region comprises a thermal conduction layer configured to conduct heat from a corresponding portion of the medium to the substrate; and the thermal conduction layer of said one or more passive thermal regions has a lower thermal resistance in a direction perpendicular to a plane of the substrate than the thermal insulation layer of said plurality of active thermal sites;

wherein the thermal insulation layer comprises one or more voids;

the thermal insulation layer comprises one or more pillars of a first thermal insulation material extending substantially perpendicular to the plane of the substrate in the area of the active thermal site between the heating element and the substrate; and said one or more voids are disposed between or around the pillars.

* * * * *